(12) United States Patent
Bailey

(10) Patent No.: US 10,096,988 B2
(45) Date of Patent: Oct. 9, 2018

(54) AUTO RECOVERING PROTECTION OF ELECTROMECHANICAL COMPONENTS IN A HIGH MAGNETIC FIELD

(71) Applicant: KONINKLIJKE PHILIPS N.V., Eindhoven (NL)

(72) Inventor: Paul Wayne Bailey, North Reading, MA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1204 days.

(21) Appl. No.: 14/350,572

(22) PCT Filed: Oct. 12, 2012

(86) PCT No.: PCT/IB2012/055546
§ 371 (c)(1),
(2) Date: Apr. 9, 2014

(87) PCT Pub. No.: WO2013/061200
PCT Pub. Date: May 2, 2013

(65) Prior Publication Data
US 2014/0285200 A1    Sep. 25, 2014

Related U.S. Application Data

(60) Provisional application No. 61/550,476, filed on Oct. 24, 2011.

(51) Int. Cl.
*H02H 3/08* (2006.01)
*G01R 33/28* (2006.01)
*H02H 7/20* (2006.01)

(52) U.S. Cl.
CPC ............ *H02H 3/08* (2013.01); *G01R 33/288* (2013.01); *H02H 7/20* (2013.01)

(58) Field of Classification Search
CPC ........... H02H 3/08; H02H 7/20; G01R 33/288
See application file for complete search history.

(56) References Cited

U.S. PATENT DOCUMENTS 3,697,808 A * 10/1972 Lee .................. A61B 5/0424
                                                           361/46
4,862,308 A *  8/1989 Udren ................. H02H 3/28
                                                           361/45
(Continued)

FOREIGN PATENT DOCUMENTS

DE         3807935   * 10/1987   ............. H02H 1/046
EP         1716878 A1   11/2006
(Continued)

OTHER PUBLICATIONS

Champagne, K., et al.; Magnetic Field Monitoring Using a Novel Wireless Sensor System in an Intra-Operative MRI Workflow; 2011; Proc. Int'l. Soc. Mag. Reson. Med.; 19:1789.

*Primary Examiner* — Zeev V Kitov

(57) ABSTRACT

An apparatus (100) protects a device (80) which has a ferrous electromechanical component which saturates in a high magnetic field (40) and draws a dangerously high electric current. A current sensor (110) senses current in excess of safe operating conditions of the protected device (80) in or near the magnetic field (40). A current switch (120) is controlled by the current sensor (110) and interposed between a power supply (90) and the device (80) to interrupt the current flow to the protected device (80) when the current sensor (110) senses current flow above a threshold due to the saturation.

17 Claims, 3 Drawing Sheets

(56) References Cited

U.S. PATENT DOCUMENTS

| | | | |
|---|---|---|---|
| 4,954,812 A * | 9/1990 | Lebron | G01R 33/07 324/260 |
| 5,629,622 A * | 5/1997 | Scampini | G01R 33/0206 324/247 |
| 6,564,084 B2 | 5/2003 | Allred, III et al. | |
| 7,564,239 B2 | 7/2009 | Mapps et al. | |
| 7,639,006 B2 | 12/2009 | Deffeyes | |
| 2007/0191914 A1 | 8/2007 | Stessman | |
| 2007/0195476 A1* | 8/2007 | Sander | H02H 3/08 361/93.1 |
| 2009/0138058 A1* | 5/2009 | Cooke | A61N 1/3718 607/5 |
| 2011/0178562 A1 | 7/2011 | Legay et al. | |

FOREIGN PATENT DOCUMENTS

| | | |
|---|---|---|
| EP | 1935450 A1 | 6/2008 |
| WO | 2006081434 A1 | 8/2006 |

* cited by examiner

AUTO RECOVERING PROTECTION OF ELECTROMECHANICAL COMPONENTS IN A HIGH MAGNETIC FIELD

CROSS REFERENCE TO RELATED APPLICATIONS

This application is a national filing of PCT application Serial No. PCT/IB2012/055546, filed Oct. 12, 2012, published as WO 2013/061200 A1 on May 2, 2013, which claims the benefit of U.S. provisional application serial no. 61/550,476 filed Oct. 24, 2011, which is incorporated herein by reference.

The present application relates to protection of electromechanical components in a high magnetic field such as near a magnetic resonance scanner.

A magnet of a magnetic resonance imaging (MRI) scanner generates a strong static field or $B_0$ field. A typical strength of the field is approximately 30,000 gauss (1 Tesla=10,000 gauss). Additional magnetic fields are generated in a MRI system using gradient coils or local coil, for spatially encoding resonance.

The scanning of some subjects occurs when the subject is under critical care. The critical care may involve an unconscious subject in an emergency situation or a subject under close monitoring. Subjects to be scanned often include other accompanying devices that participate in their care. These devices include life sustaining equipment such as ventilators, injectors, or infusion pumps. The devices may include monitoring devices such as blood pressure monitors, $CO_2$ monitors, or anesthesia gas monitors. The devices may include ancillary devices such as printers, workstations, or even entertainment devices.

All these devices may accompany a subject who is to be scanned. When these devices are moved into the magnetic field, the devices are frequently damaged. Many of these devices are expensive and costly to repair or replace. Typically, when a device is operated in a high magnetic field, electromechanical components in the device burn out. In the high magnetic field, ferrous components can saturate causing excessive current to be drawn. Such electromechanical components include motors, pumps, and solenoids.

A common response to preventing damage to devices is product labeling. The product labels warn against operating the device near a magnetic field which is usually a warning not to use the product in an MRI environment or to limit the distance that the product can be in proximity to a high powered magnet. Rooms containing scanners are often marked on their floor with tape that indicates such distances e.g. a 5000 gauss line. This is difficult and calls for attention by care givers, who are focused on the care of the subject. In addition, the distance relation between the strength of the magnetic field and the distance to the magnet is non-linear. The magnetic field is strongest at the poles and weakest between poles. This makes estimation of the effect of a high magnetic field difficult for a care provider.

Another response is to add magnetic shielding to a product. However, the magnetic shielding is heavy and limits portability and in some cases safety of the product. If the shielding comes proximate to the magnet, it is attracted to the isocenter of the magnet which can result in a projectile moving toward and in the bore of the high powered magnet. The bore is the same space in which a subject is located during the scanning process.

Magnetic field sensors could be used, but measuring the magnetic field directly with magnetic field sensors is difficult. Multiple sensors would be needed to compensate for orientational sensitivity of the sensors relative to the magnetic field.

The present application provides a new and improved device protection mechanism in high magnetic fields which overcomes the above-referenced problems and others.

In accordance with one aspect, an apparatus for protecting electromechanical components in a magnetic field includes a current sensor and a current switch. The current sensor senses current draw in excess of safe operating conditions by a protected device. The current switch, connected to the current sensor and interposed between a power supply and the protected device, interrupts the current flow to the protected device based on the current draw sensed by the current sensor.

In accordance with another aspect, an MRI scanner room power supply includes an MRI scanner, a medical device and an apparatus for protecting the medical device. The MRI scanner generates a magnetic field of at least 10,000 gauss. The medical device is used in conjunction with a patient to be scanned by the MRI scanner. The apparatus interrupts the current flow to the medical device in response to being moved into sufficient proximity to the MRI scanner that ferrous components in the medical device saturate.

In accordance with another aspect, a method of protecting an electromechanical device in a magnetic field includes sensing current flow to a device which has electromechanical components which saturate in a magnetic field and draw current above a threshold. The current flow is interrupted to the device in response to the sensed current exceeding a threshold.

One advantage resides in the prevention of damage to devices due to a magnetic field.

Another advantage resides in automatic recovery.

Another advantage resides in automatic power restoration when conditions are safe.

Another advantage resides in easy incorporation into new and existing devices.

Another advantage is that the magnetic field intensity and geometry do not need to be measured.

Still further advantages will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
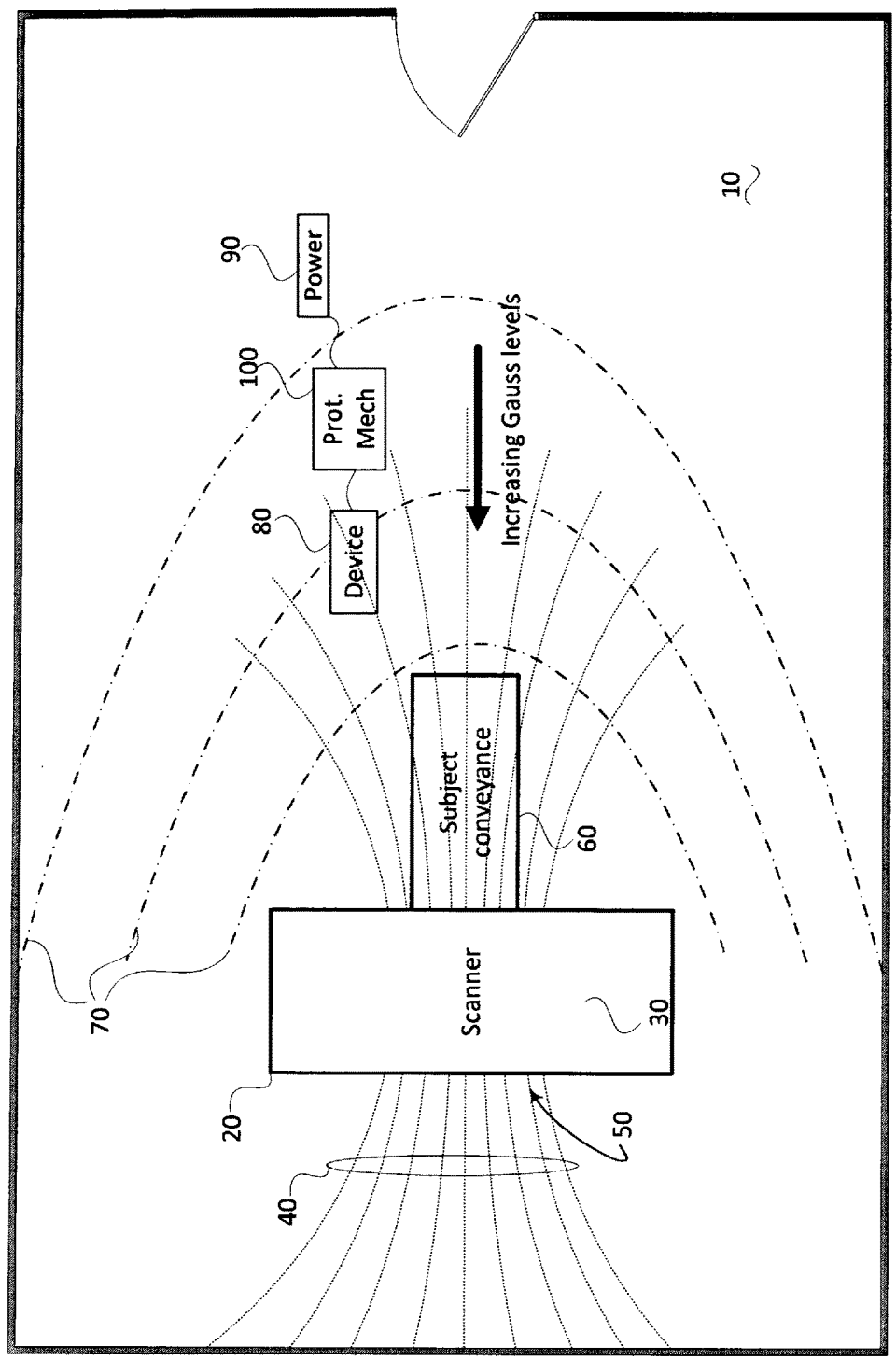
FIG. 1 is diagrammatic illustration of a typical room containing a MRI scanner.

With reference to FIG. 1, a typical room 10 containing a MRI scanner 20 is illustrated. The scanner 20 contains a powerful magnet 30. The magnet 30 emits a magnetic field 40 which is strongest at either opening of a bore 50 and decreases with distance away from the magnet. A subject is placed on a patient conveyance 60 or couch which moves in the bore 50 during scanning Warning lines 70 are often marked on the floor, which provide caregivers reference points regarding the increasing strength of the magnetic field 40, e.g. a 3000 gauss line, a 5000 gauss line, a 10000 gauss line or the like. A device 80 is connected to a power source 90. Some power sources are portable and include a battery. Other power sources include electrical power outlets.

The devices 80 include ventilators, injectors, infusion pumps, monitoring devices such as blood pressure monitors, $CO_2$ monitors, anesthesia gas monitors, and the like as well as ancillary devices such as printers, workstations, and entertainment devices. The devices 80 include any device which uses a motor or a solenoid or other ferrous components. The power source 90 may be incorporated into the device 80, separated as an individual component, or a plug which uses a standard outlet for power. Some power sources 90 include an AC/DC converter. The power requirements are specific to the device 80. The effect of the magnetic field 40 on the device is determined with a hysteresis or BH curve. The current drawn by the device 80 continues to increase as the device 80 experiences an increasing magnetic field 40 until a maximum is reached when the ferrous core or other components saturate. At the saturation point the device 80 is susceptible to damage or burn-out of electromechanical components due to the excess current draw. A protection mechanism 100 is interposed between the device and the power source to protect the device from damage due to a magnetic field induced excessive current draw.

An embodiment of the protection mechanism 100 determines the current draw of the device as the device 80 experiences an increase in the magnetic field 40 intensity. When the device 80 is near saturation, the protection mechanism interrupts the current from the power source 90. The power remains interrupted while the device 80 is near saturation. As the device 80 moves away from the magnetic field 40 or the magnetic field 40 decreases in intensity, the power automatically resumes.

Figure 2:
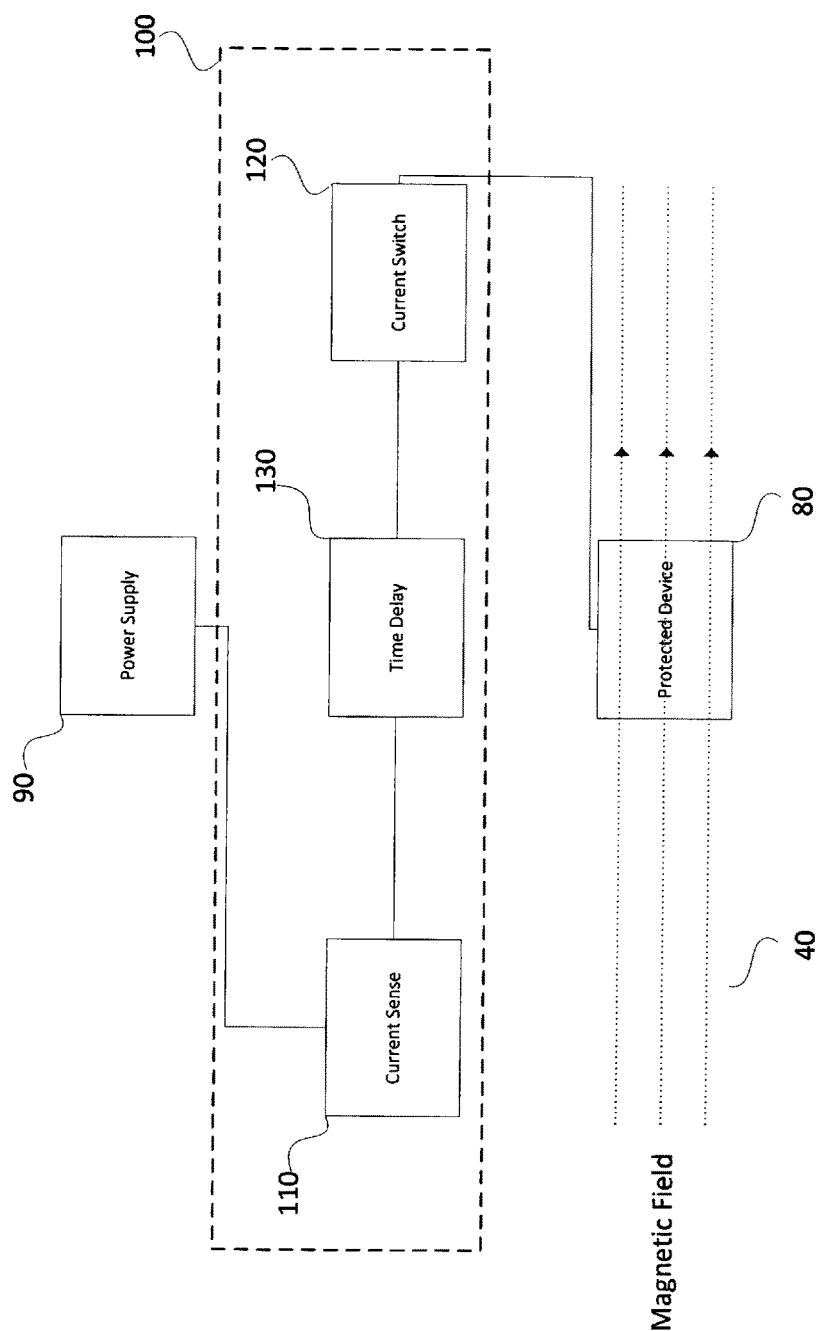
FIG. 2 is a diagram illustrating the components of an embodiment of the protection mechanism.

With reference to FIG. 2, a diagram illustrates components of one embodiment of the protection mechanism 100. When the protected device 80 moves into the magnetic field 40, the current drawn by the device 80 increases. A current sensor 110 determines whether the device 80 is operating within safe current draw operating margins specific to the device 80. If the current sensor 110 determines that the device 80 is not within safe operating conditions, e.g. drawing too much current, then a current switch 120 is opened which blocks the flow of the current to the protected device 80. When the high current is detected, a time delay 130 is invoked such that the current switch does not open during normal current surges, e.g., when a motor first starts up. In another embodiment, the timer periodically check whether the overcurrent condition has been resolved, particularly by the device moving away from the magnet. At the end of the time period, e.g. a few milliseconds, the current switch is closed and the current draw is re-checked. If the current draw is still too high, the current switch re-opens.

The current sensor 110, in one embodiment, includes a resistor in series with the power supply 90. The resistance is based on the range of normal operating current for the particular device 80. The voltage across the resistor can be read in conjunction with several commercially available current shunt monitor integrated circuits such as a INA193 or AD8207.

The time delay circuit 130 such as a resistive/capacitive circuit, inserts a predetermined delay before the current switch opens to prevent false shut downs due to normal current surges characteristic of electromechanical devices. That is, when the current sensor senses a current above a threshold, the time delay circuit provides a delay period for the current to drop off below the threshold before the switch is opened. The time delay, on the order of milliseconds, can be adjustable for the device or situation.

The current switch 120 interrupts current based on the current sensor 110 determination that the current draw exceeds a threshold. The current switch 120 such as a power field effect transistor (FET) disconnects the power source 90 before a saturation induced excessive current draw damages the device 80.

Figure 3:
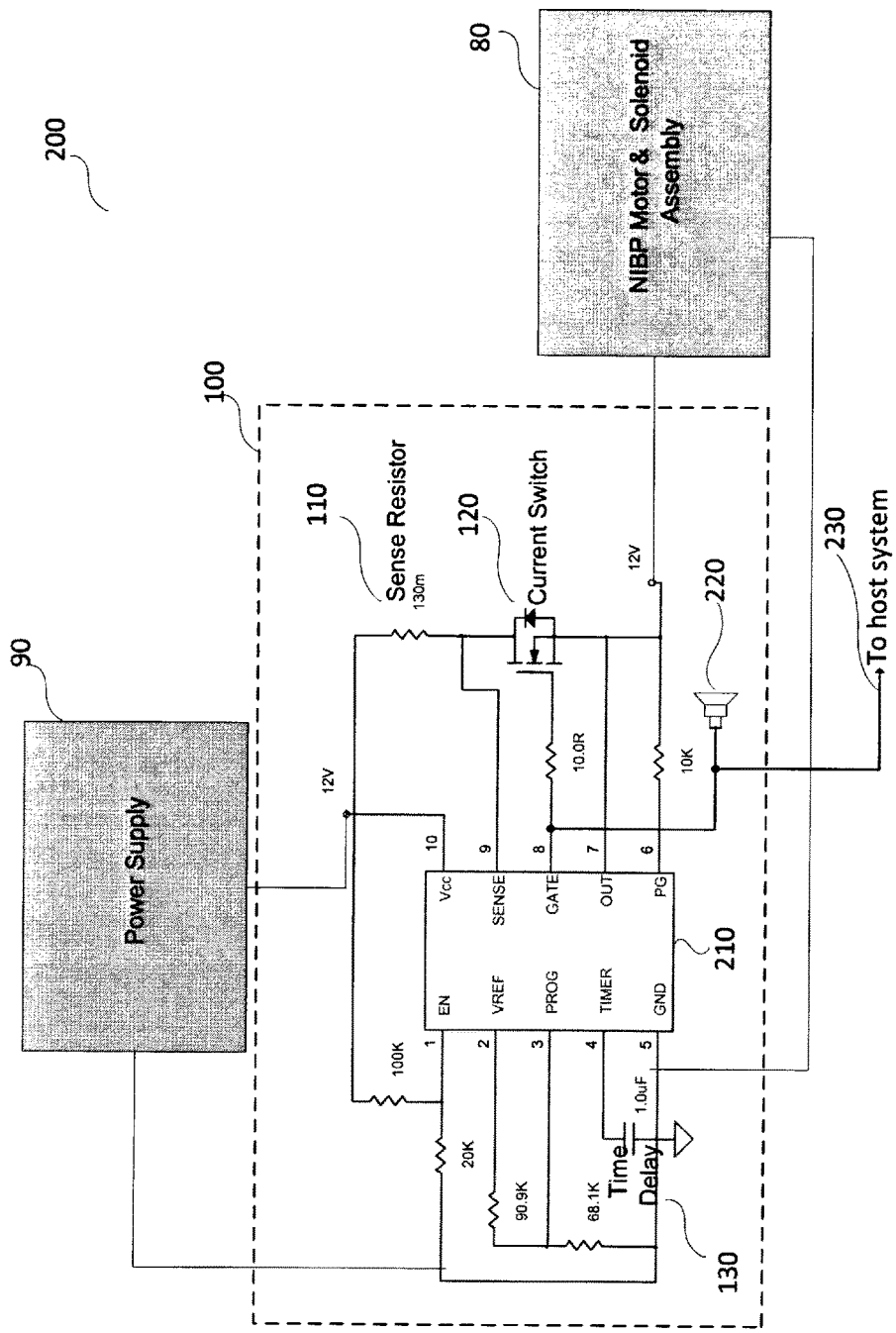
FIG. 3 is a circuit diagram illustrating an embodiment of the protection mechanism for a non-invasive blood pressure monitor.

With reference to FIG. 3, a circuit diagram shows an embodiment in which the device 80 includes a non-invasive blood pressure (NIBP) monitor 200. The power supply 90 outputs a 12V direct current (DC). The direct current may be directly from a battery or may be converted from a standard wall outlet (110V or 220V AC) to 12V direct current. The protection mechanism 100 is placed between the power source 90 and the protected device 80, particularly a motor and solenoid assembly of the NIBP monitor 200. With the protection mechanism 100, the NIBP monitor which would have been damaged at 400 gauss can be exposed to magnetic fields 40 of 30,000 gauss or more without damage.

Various components can be used to implement embodiments of the protection mechanism 100. In one embodiment, a commercially available hot swap power management integrated circuit is used. A sense sensor 110 includes a resistor to sense the current drawn by the protected device. A processor circuit 210 compares the sensed current with a threshold and controls a gate of FET current switch 120 to open the FET in accordance with the comparison. The resistive/capacitive time delay 130 delays opening the current switch for a preselected duration commensurate with normal current surges drawn by the device. In one embodiment, a warning signal is sent to a warning device 220, such as a light or tone generator, to warn technicians that the device has stopped working. The warning signal can also be sent to a host system 230. In one embodiment, the current switch stays open until reset by one of the technicians. In another embodiment, the current switch closes after a selected duration to check if the device is still trying to draw too much current.

The warning signal can be terminated when the current flow to the device resumes. This signal notifies the caregiver of the interruption of power to the protected device, and that the device is in danger due to the high magnetic field. The caregiver can move the device to a point far enough way for the signal to terminate and power to resume to the protected device.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. An apparatus for protecting electromechanical components from excessive current draw due to saturation by a magnetic field, the apparatus comprising:
    a current sensor which senses current draw in excess of safe operating conditions by a protected device; and
    a current switch connected to the current sensor and interposed between a power supply and the protected device which interrupts the current flow to the protected device based on the current draw sensed by the current sensor;
    wherein the apparatus is a separate component which the protected device plugs into and in turn plugs into a power outlet.

2. The apparatus according to claim 1, wherein the current switch restarts the current flow when saturation conditions are reduced such that current in excess of the safe operating conditions is no longer drawn.

3. The apparatus according to claim 1, wherein the safe operating conditions are determined by a hysteresis curve of a ferrous electromechanical component of the protected device.

4. The apparatus according to claim 1, further including:
a warning device which warns a clinician that current is interrupted and the device has stopped functioning, the warning device includes at least one of:
 a visual indicator;
 an audible indicator;
 a signal to the protected device; and
 a signal to a host system.

5. The apparatus according to claim 1, further including:
a time delay circuit which delays interruption of the current flow by the current switch by a pre-determined time period.

6. The apparatus according to claim 1, further including:
a circuit which controls the current switch based on the sensed current draw by the current sensor, the circuit holding the current switch open for a pre-selected duration.

7. The apparatus according to claim 6 wherein after the preselected duration, the current switch closes supplying current to the device until and unless the current sensor senses that the current draw exceeds the safe operating conditions.

8. The apparatus according to claim 1, wherein the protected device includes a patient monitoring device.

9. The apparatus according to claim 1, wherein the protected device includes at least one of:
 a pump;
 a motor; and
 a solenoid.

10. The apparatus according to claim 1, wherein the protected device includes at least one of:
 a NIBP monitor;
 a CO2 monitor;
 a printer;
 a ventilator;
 an anesthesia workstation;
 an injector;
 an infusion pump;
 an entertainment device; and
 an anesthesia gas monitor.

11. A MRI scanner room power supply comprising:
an MRI scanner which generates a magnetic field of at least 10,000 gauss; and
the apparatus according to claim 1, for protecting a medical device for use in conjunction with a patient to be scanned by the MRI scanner by interrupting the current flow to the medical device in response to being moved into sufficient proximity to the MRI scanner that ferrous components in the medical device saturate.

12. An apparatus for protecting an electromechanical component from excessive current draw due to saturation by a magnetic field, the apparatus comprising:
a current sensor connected to sense current draw by a protected device;
a current switch interposed between a power supply and the protected device and configured to interrupt the current flow to the protected device in response to the current sensor sensing the current draw by the protected device exceeds a threshold; and
a time delay circuit which delays interruption of the current flow by the current switch by a pre-determined time period.

13. The apparatus according to claim 12, wherein:
the current switch comprises an integrated circuit connected to the current sensor to compare the sensed current with the threshold and control an FET to open in accord with the comparison; and
the time delay circuit comprises a resistor and a capacitor connected with the integrated circuit to delay opening of the FET by the pre-determined time period.

14. The apparatus of claim 13 wherein the integrated circuit operates to close the FET after a selected duration and to subsequently reopen the FET if the current draw by the protected device is still in excess of the threshold.

15. The apparatus of claim 12 wherein the current switch is configured to periodically close to re-check the current draw and to re-open if the current draw by the protected device is still in excess of the threshold.

16. The apparatus of claim 12 wherein the current switch activates a light or tone generator to indicate the interruption of current flow to the protected device.

17. The apparatus of claim 12 wherein the apparatus is a separate component from the protected device.

* * * * *